United States Patent
Song et al.

(10) Patent No.: US 7,846,001 B2
(45) Date of Patent: Dec. 7, 2010

(54) MANUFACTURE AND METHOD OF SEALING AN ORGANIC LIGHT EMITTING DISPLAY

(75) Inventors: Seung-yong Song, Suwon (KR);
Young-seo Choi, Suwon (KR);
Kwan-hee Lee, Suwon (KR);
Sun-young Jung, Suwon (KR); Oh-june Kwon, Suwon (KR); Young-cheol Zu, Suwon (KR); Ji-hun Ryu, Suwon (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 593 days.

(21) Appl. No.: 11/843,648

(22) Filed: Aug. 23, 2007

(65) Prior Publication Data

US 2008/0160864 A1    Jul. 3, 2008

(30) Foreign Application Priority Data

Jan. 3, 2007  (KR) .................. 10-2007-0000637
Jan. 30, 2007 (KR) .................. 10-2007-0009701

(51) Int. Cl.
*H01J 9/00* (2006.01)
*H01J 9/40* (2006.01)

(52) U.S. Cl. .......................... 445/25; 445/24
(58) Field of Classification Search ............ 445/24, 445/25, 3, 6
See application file for complete search history.

(56) References Cited

U.S. PATENT DOCUMENTS 6,873,174 B2 * 3/2005 Matsunaga et al. .......... 324/770

2005/0023956 A1 * 2/2005 Kwak et al. ................. 313/495

FOREIGN PATENT DOCUMENTS

| JP | 10074583 A | * 3/1998 |
| JP | 2001-297878 | 10/2001 |
| JP | 2003297555 A | * 10/2003 |

(Continued)

OTHER PUBLICATIONS

Korean Patent Abstracts, Publication No. 100636502 B1, dated Oct. 12, 2006, in the name of Won Kyu Kwak et al.

(Continued)

*Primary Examiner*—Mariceli Santiago
(74) *Attorney, Agent, or Firm*—Christie, Parker & Hale, LLP

(57) ABSTRACT

A method for manufacturing an organic light emitting display. Pixel portions are formed on a mother substrate. A test wiring for testing pixel portions is formed at a peripheral portion of the mother substrate. A sealing material is formed at one surface of a sealing substrate to enclose the pixel portions, the sealing substrate being sealed to be spaced apart from the mother substrate. A spacer is formed at a side region of the one surface of the sealing substrate on which the sealing material is formed. The mother substrate and the sealing substrate are adhered to each other by the sealing material to seal the pixel portions within an enclosure formed by the mother substrate, sealing surface, and sealing material. A part of the sealing substrate is scribed and removed to expose the test wiring, the part of sealing substrate being arranged over a portion of the test wiring.

20 Claims, 7 Drawing Sheets

FOREIGN PATENT DOCUMENTS

| | | | | |
|---|---|---|---|---|
| JP | 2005078932 A | * | 3/2005 | |
| JP | 2007-5060 | | 1/2007 | |
| JP | 2008140615 A | * | 6/2008 | |
| KR | 2003-0058616 | | 7/2003 | |
| KR | 10-2003-0094849 | | 12/2003 | |
| KR | 10-2004-0011671 | | 2/2004 | |
| KR | 10-0636502 | | 10/2006 | |
| KR | 10-0662994 | | 12/2006 | |

OTHER PUBLICATIONS

Korean Patent Abstracts, Publication No. 100662994 B1, dated Dec. 21, 2006, in the name of Ju Won Lee et al.

Patent Abstracts of Japan, Publication No. 2001-297878, dated Oct. 26, 2001, in the name of Hitoshi Wakai et al.

Patent Abstracts of Japan, Publication No. 2007-005060, dated Jan. 11, 2007, in the name of Hideyo Nakamura.

Korean Patent Abstracts, Publication No. 1020030058616, dated Jul. 7, 2003, in the name of Yeon Hak Jung et al.

KIPO Notice of Allowance for priority Korean application 10-2007-0009701, dated Dec. 14, 2007, with English translation.

Korean Patent Abstracts, Publication No. 1020040011671, Published on Feb. 11, 2004, in the name of Kim.

Korean Patent Abstracts, Publication No. 1020030094849, Published on Dec. 18, 2003, in the name of Kim, et al.

* cited by examiner

MANUFACTURE AND METHOD OF SEALING AN ORGANIC LIGHT EMITTING DISPLAY

CROSS-REFERENCE TO RELATED APPLICATIONS

This application claims priority to and the benefit of Korean Patent Application No. 10-2007-0000637, filed on Jan. 3, 2007, and No. 10-2007-0009701, filed on Jan. 30, 2007, in the Korean Intellectual Property Office, the entire contents of which are incorporated herein by reference.

BACKGROUND

1. Field of the Invention

The present invention relates to a method for manufacturing an organic light emitting display.

2. Discussion of Related Art

In general, after a plurality of pixel portions in an organic light emitting display are formed on a substrate, they are scribed to divide into separate panels. A method for testing whether or not panels are defective can be divided into testing types.

In a first testing type, after a substrate is scribed into separate panels, the panels are separately tested. However, in this testing type, if a circuit wiring forming a panel or a size of the panel varies, testing equipment or a zig required for a test should be changed. Further, because the panels should be separately tested, a performance of the test is deteriorated.

In a second testing type, a substrate is scribed in columns or rows and a test of a stick unit is performed. The testing type envisions that respective panels are formed by a liquid crystal, and include testing pads formed at both sides of a stick in order to perform the test of the stick unit. In particular, a testing process of a stick unit is performed by a naked eye test (or by the naked eye).

In a case of the liquid crystal display, there is a demand for a process of injecting a liquid crystal between an upper substrate and a lower substrate. Items of a characteristic test are centered to perform the naked eye test. Accordingly, although a test is carried in a stick unit, the testing time is not increased. However, in a case of an organic light emitting display, in a state that an organic emission layer is previously formed, in addition to the naked eye test, there is a need for a plurality of other test items (or tests). Accordingly, when a panel of the organic light emitting display is tested in a stick unit, a testing time is increased. As such, there is need to test the panel of the organic light emitting display in a sheet unit.

Hereinafter, a method for manufacturing an organic light emitting display to test the organic light emitting display formed in a sheet unit will be described in more detail.

FIG. 1 is a cross-sectional view showing an organic light emitting display, which is formed in a sheet unit.

With reference to FIG. 1, a plurality of pixel portions 120 are formed on a mother substrate 110, and each of the pixel portions 120 includes one or more organic light emitting diodes. Each of the organic light emitting diodes includes an anode electrode, an emission layer, and a cathode electrode. The anode electrode of the organic light emitting diode is electrically connected to a drain electrode of a thin film transistor. Here, the thin film transistor is formed at a lower surface of an opening of a pixel definition film. The emission layer is formed at an upper portion of the anode electrode. The cathode electrode is formed on the emission layer and the pixel definition film.

When a voltage (which may be predetermined) is applied to the anode electrode and the cathode electrode of the organic light emitting diode, holes injected from the anode electrode are transported to the emission layer through a hole transport layer forming the emission layer. Further, electrons injected from the cathode electrode are injected to the emission layer through an electron transport layer. Here, the electrons and the holes are recombined with each other at the emission layer to generate excitons. As the excitons change from an excited state to a ground state, the emission layer emits light to form images.

Furthermore, a test wiring 130 for testing a panel in a sheet unit is formed at a peripheral part of the mother substrate 110. More particularly, an organic light emitting display mother substrate is a substrate on which display panels can be simultaneously (and/or concurrently) tested on a substrate basis before the substrate is divided into individual panels.

When the test wiring 130 receives an external drive signal, it supplies the external drive signal to lines coupled to a panel to test the panel in a sheet unit. So as to test a plurality of pixel portions formed on the substrate 110 in a sheet unit, a test wiring 130 formed at a peripheral part of the mother substrate 110 is exposed to an exterior, and receives an external signal and is tested on whether or not respective pixel portions 120 are defective. Here, in order to receive the external signal, a sealing substrate 150 arranged at an upper portion of the test wiring 130 is removed to expose the test wiring 130 to the exterior.

However, when the mother substrate 110 is adhered to the sealing substrate 150, a pressure from several tons to several tens of tons is applied to the mother substrate 110 and the sealing substrate 150, thereby causing the sealing substrate 150 to contact the peripheral region of the mother substrate 110 on which the test wiring 130 is formed. When the mother substrate 110 contacts with the sealing substrate 150 as described above, an electrostatic force occurs between the mother substrate 110 and the sealing substrate 150. Accordingly, when the sealing substrate 150 formed at an upper portion of the test wiring 130 is scribed and removed, a surface of the test wiring 130 is damaged, with the result that a sheet test cannot be performed.

SUMMARY OF THE INVENTION

An aspect of an embodiment of the present invention is directed to a method for manufacturing an organic light emitting display that removes a sealing substrate arranged on a test wiring.

Another aspect of an embodiment of the present invention is directed to a method for manufacturing an organic light emitting display capable of removing a sealing substrate, which is arranged on a test wiring.

An embodiment of the present invention provides a method for manufacturing an organic light emitting display. The method includes: forming a plurality of pixel portions on a mother substrate; forming a test wiring for testing the plurality of pixel portions at a peripheral portion of the mother substrate; forming a sealing material on one surface of a sealing substrate to enclose the plurality of pixel portions, the sealing substrate being spaced apart from the mother substrate; forming a spacer at a side region of the one surface of the sealing substrate on which the sealing material is also formed; adhering the mother substrate and the sealing substrate to each other with the sealing material to seal the pixel portions within an enclosure formed by the mother substrate, the sealing substrate, and the sealing material; and scribing and removing a part of the sealing substrate to expose the test wiring, the removed part of the sealing substrate being arranged over a portion of the test wiring.

In one embodiment, the spacer includes a substantially identical material as that of the sealing material. In one embodiment, the spacer is formed on the portion of the test wiring over which the removed part of the sealing substrate is arranged. In one embodiment, the spacer is formed on a side portion of the mother substrate on which the test wiring is formed. In one embodiment, the sealing material is an inorganic material, and the forming of the sealing material includes irradiating the inorganic sealing material with a laser beam or ultraviolet rays to melt the inorganic sealing material. In one embodiment, the inorganic sealing material is a frit glass.

According to a second embodiment of the present invention, there is provided a method for manufacturing an organic light emitting display. The method includes: forming an organic light emitting diode at a display region of a substrate; forming a driver and a pad portion at a non-display region of the substrate, the substrate being divided into the display region and the non-display region; forming a sealing material on one surface of a sealing substrate to cover the display region of the substrate, the sealing substrate being spaced apart from the substrate; forming a spacer at a side region of the one surface of the sealing substrate on which the sealing material is also formed; adhering the substrate and the sealing substrate to each other with the sealing material to seal the display region of the substrate; and scribing and removing a part of the sealing substrate to expose the pad portion, the removed part of sealing substrate being arranged over a part of the pad portion.

In one embodiment, the spacer includes a substantially identical material as that of the sealing material. In one embodiment, the spacer is formed on the part of the pad portion over which the sealing substrate is arranged. In one embodiment, the sealing material is formed on a portion of the driver. In one embodiment, the method further includes connecting the exposed pad portion to a flexible printed circuit board. In one embodiment, the sealing material is an inorganic material, and the forming of the sealing material includes irradiating the inorganic sealing material with a laser beam or ultraviolet rays to melt the inorganic sealing material. In one embodiment, the inorganic sealing material is a frit glass.

According to a third embodiment of the present invention, there is provided a method for manufacturing an organic light emitting display. The method includes: forming a plurality of organic light emitting diodes on a mother substrate; forming a test wiring for testing the plurality of organic light emitting diodes at a peripheral portion of the mother substrate; forming a sealing material on one surface of a sealing substrate to enclose the plurality of organic light emitting diodes, the sealing substrate being spaced apart from the mother substrate; forming a spacer at a side region of the one surface of the sealing substrate on which the sealing material is also formed; adhering the mother substrate and the sealing substrate to each other with the sealing material to seal the plurality of organic light emitting diodes within an enclosure formed by the mother substrate, the sealing substrate, and the sealing material; and scribing and removing a part of the sealing substrate to expose the test wiring, the removed part of sealing substrate being arranged over a portion of the test wiring.

In one embodiment, the method further includes connecting the exposed test wiring to a probe to panel test the organic light emitting display.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
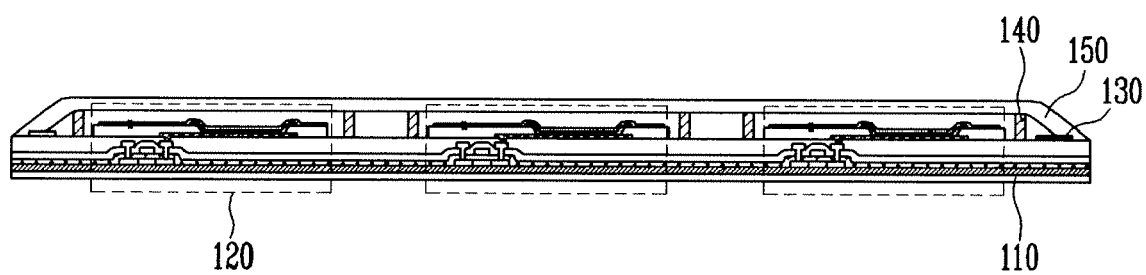
FIG. 1 is a cross-sectional view showing an organic light emitting display, which is formed in a sheet unit.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Figure 2:
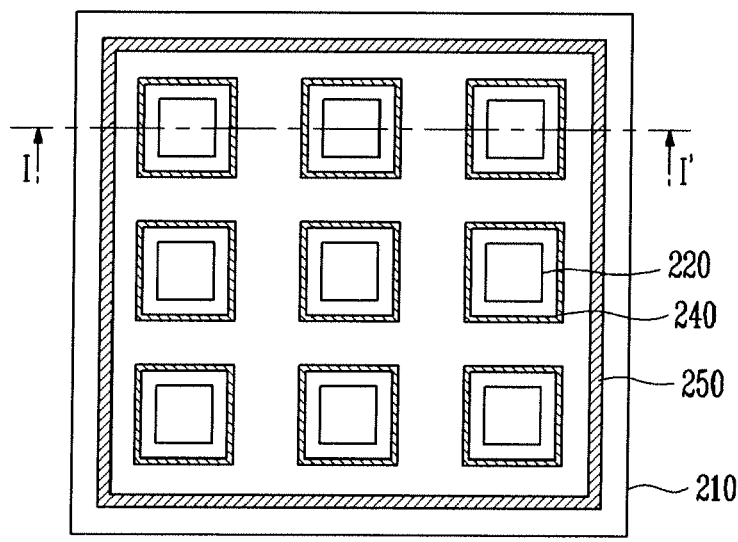
FIG. 2 is a plan view showing an organic light emitting display formed in a sheet unit according to a first embodiment of the present invention.
Figure 3:
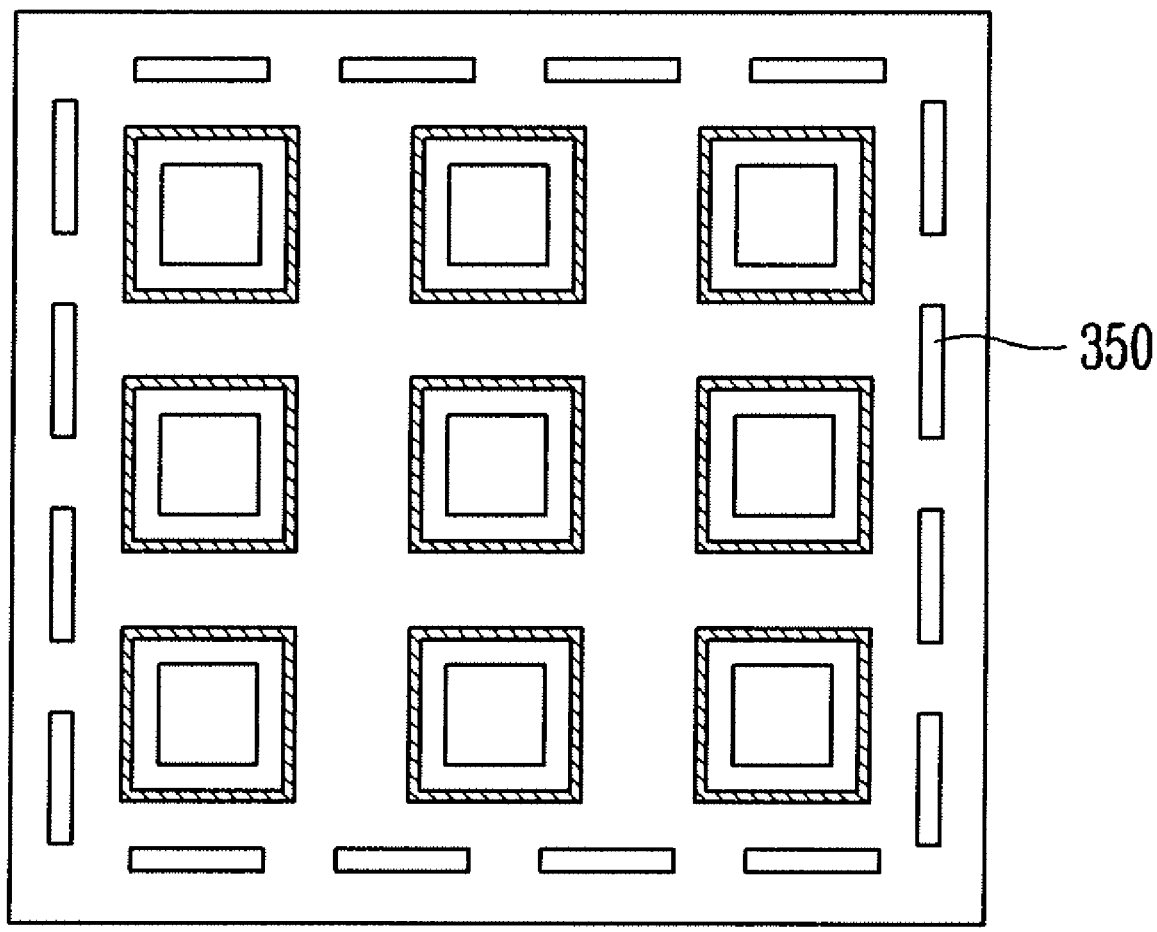
FIG. 3 is a plan view showing an organic light emitting display formed in a sheet unit according to a second embodiment of the present invention.
Figure 4:
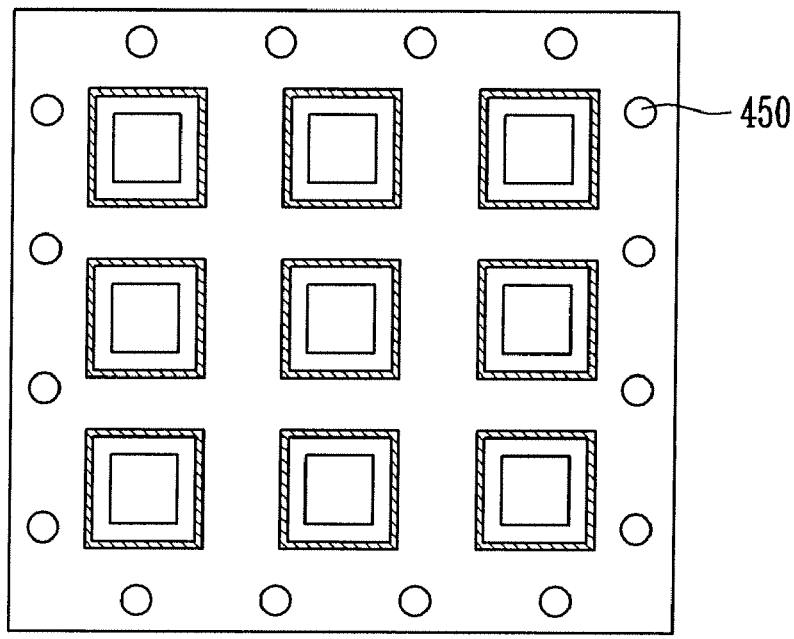
FIG. 4 is a plan view showing an organic light emitting display formed in a sheet unit according to a third embodiment of the present invention.
Figure 5:
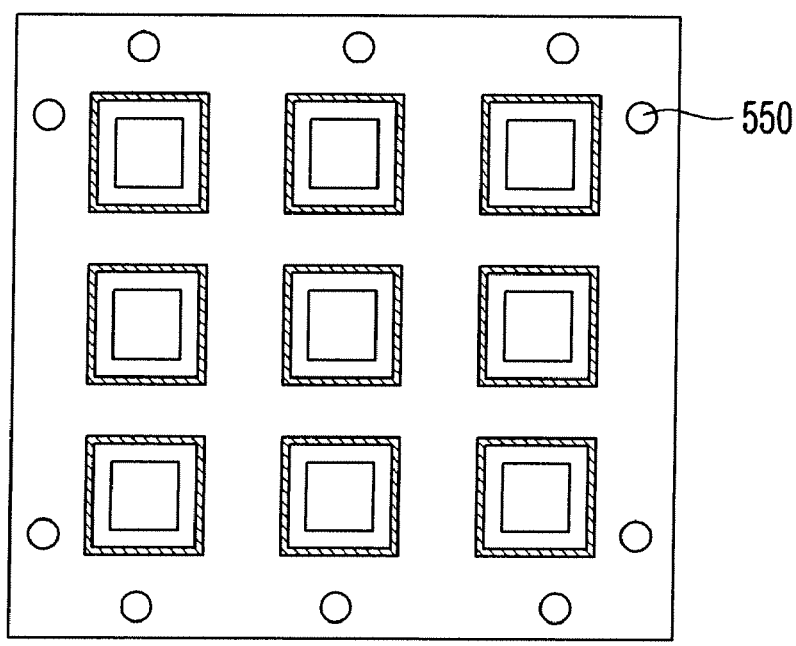
FIG. 5 is a plan view showing an organic light emitting display formed in a sheet unit according to a fourth embodiment of the present invention.

FIG. 2 is a plan view showing an organic light emitting display formed in a sheet unit according to a first embodiment of the present invention. FIG. 3 is a plan view showing an organic light emitting display formed in a sheet unit according to a second embodiment of the present invention. FIG. 4 is a plan view showing an organic light emitting display formed in a sheet unit according to a third embodiment of the present invention. FIG. 5 is a plan view showing an organic light emitting display formed in a sheet unit according to a fourth embodiment of the present invention.

Referring from FIG. 2 to FIG. 5, the organic light emitting display includes a plurality of pixel portions 220, a scan driver, a data driver, and a test wiring. One or more organic light emitting diodes are connected with a scan line and a data line in a matrix at each of the pixel portions 220. Also, each of the organic light emitting diodes includes a first electrode, an emission layer, and a second electrode.

When the plurality of organic light emitting diodes formed at the pixel portion 220 are exposed to moisture or oxygen, they can be degraded. As such, to protect the organic light emitting diodes from degradation, the organic light emitting diodes are sealed from an exterior environment. In order to seal the pixel portions 220, after an inner surface of the sealing substrate is coated with a sealing material 240 in a region corresponding to peripheral directions of respective pixel portions 220, the sealing substrate is adhered to the mother substrate 210.

In addition, a test wiring is formed at a peripheral part of the mother substrate 210 in a sheet unit to test the organic light emitting display (e.g., to test the pixel portions 220). A test wiring is used so that the test can be performed on a mother substrate before the mother substrate is divided into individual panels. More particularly, when the test wiring receives an external drive signal, it supplies the external drive signal to lines coupled with the organic light emitting display, that allows the organic light emitting display (e.g., the pixel portions or panel) formed in the sheet unit to be tested.

In addition, a spacer 250 may be formed either between a test wiring formed on the mother substrate 210 or between at least one side of the mother substrate 210 on which a test wiring is formed and the sealing substrate. The spacer 250 is formed to more easily remove the sealing substrate arranged at an upper portion of the test wiring in order to test the organic light emitting display (e.g., to test the pixel portions or panel) formed in the sheet unit. For FIG. 2 of the description, the spacer 250 is formed at peripheral regions of the mother substrate 210 and the sealing substrate. The spacer 250 spaces the test wiring and the sealing substrate apart from each other to block or prevent the mother substrate 210 from contacting with the sealing substrate, thereby allowing for easy removal of the sealing substrate arranged at an upper portion of the test wiring.

The spacer 250 may be formed to have a tetragonal shape along a peripheral part of the substrate 210. Alternatively, as shown in FIG. 3, FIG. 4, or FIG. 5, the spacer 350, 450, 550 can be formed in various suitable patterns such as a bar shape or a rectangular shape. Further, the spacer 250 can be manufactured by various materials, but, in one embodiment of the present invention, the spacer 250 (350, 450, 550) is formed by a frit glass. For example, the frit glass may be formed by at least one material selected from the group consisting of $K_2O$, $Fe_2O_3$, $Sb_2O_3$, ZnO, $P_2O_5$, $V_2O_5$, $TiO_2$, $Al_2O_3$, $WO_3$, SnO, PbO, and combinations thereof. Moreover, since the spacer 250 is formed of the frit glass, it can be attached and detached to and from the substrate 210 and still not be stained.

Figure 6A:
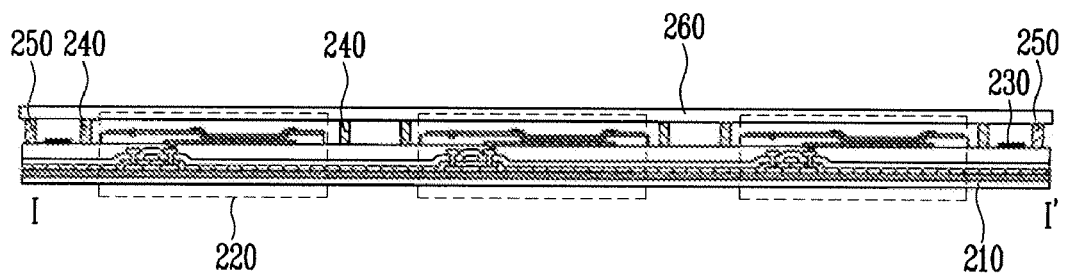
FIG. 6A, FIG. 6B, and FIG. 6C are cross-sectional views of the organic light emitting display taken along a line I-I' of FIG. 2, and are for describing a process for manufacturing the organic light emitting display formed in the sheet unit in order to test the organic light emitting display.
Figure 6B:
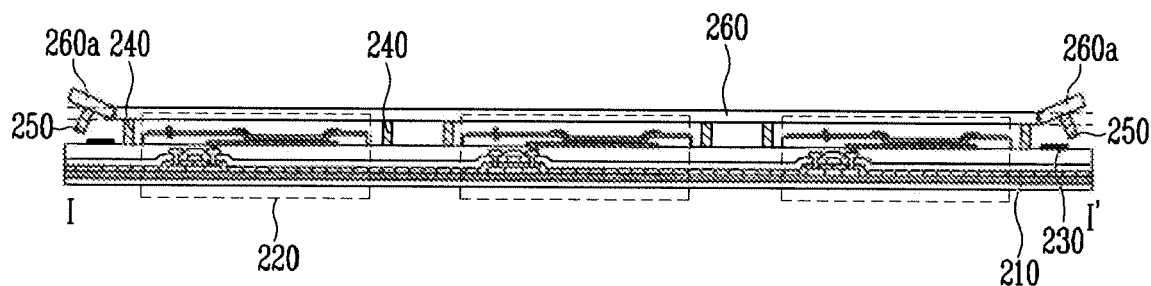
Figure 6C:
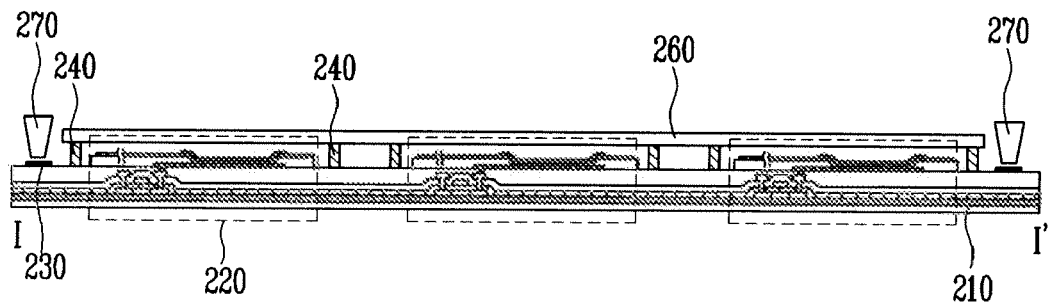

FIG. 6A to FIG. 6C are cross-sectional views of the organic light emitting display taken along a line I-I' of FIG. 2, and are for describing a process for manufacturing the organic light emitting display formed in a sheet unit in order to test the organic light emitting display.

With reference to FIG. 6A, to test the organic light emitting display in a sheet unit, a mother substrate 210 is prepared. Here, a pixel portion 220 including one or more organic light emitting diodes is formed at (or on) the mother substrate 210. A test wiring 230 is further formed at (or on) a peripheral part of the mother substrate 210 to test the pixel portions (or panel) 220 in a sheet unit. The test wiring 230 functions to test the organic light emitting display in the sheet unit. A signal is applied to respective pixel portions 220 through the test wiring 230 that allows the pixel portion 220 to be tested.

Moreover, to seal the organic light emitting diodes formed on the mother substrate 210, an inner side surface of the sealing substrate 260 corresponding to a peripheral boundary (or direction) of respective pixel portions 220 is coated with the sealing material 240 to adhere the sealing substrate 260 on the mother substrate 210. The sealing material 240 may be formed by the same material as that of a spacer 250.

The spacer 250 is formed at a peripheral part of the mother substrate 210. As the spacer 250 is formed at an inner side surface of the sealing substrate 260 corresponding to a peripheral part of the mother substrate 210, it maintains the mother substrate 210 and the sealing substrate 260 to be spaced apart from each other by a distance (that may be predetermined). As such, when the sealing substrate 260 is adhered to the mother substrate 210 and spaced apart from each other by a height of the spacer 250, the spacer 250 can prevent (or block) a peripheral region of the mother substrate 210 and a peripheral region of the sealing substrate 260 from contacting each other. In addition, the sealing substrate 260 arranged at an upper portion of the test wiring 230 can be more easily removed.

In addition, a laser or ultraviolet rays are irradiated onto the sealing material 240 to melt the sealing material 240.

With reference to FIG. 6B, to expose the test wiring 230 to an exterior, a sealing substrate (or sealing substrate portion) 260a arranged at an upper portion of the test wiring 230 is scribed and removed. At this time, since the spacer 250 formed at the scribed sealing substrate 260a is not melted using the laser or ultraviolet rays, when the sealing substrate 260a arranged at an upper portion of the test wiring 230 is scribed and removed, the spacer 250 is removed from the mother substrate 210 together with the sealing substrate 260a. Since the spacer 250 attached to an inner side surface of the scribed sealing substrate 260a is not adhered to the mother substrate 210, it does not stain the mother substrate 210 at a portion from which the sealing substrate 206a is removed.

Referring to FIG. 6C, the test wiring 230 exposed to an exterior receives a drive signal from the exterior by a transfer member, e.g., a probe 270, and supplies the drive signal to lines coupled with respective pixel portions 220 to test whether or not the pixel portions 220 formed on the mother substrate 210 are defective.

Figure 7:
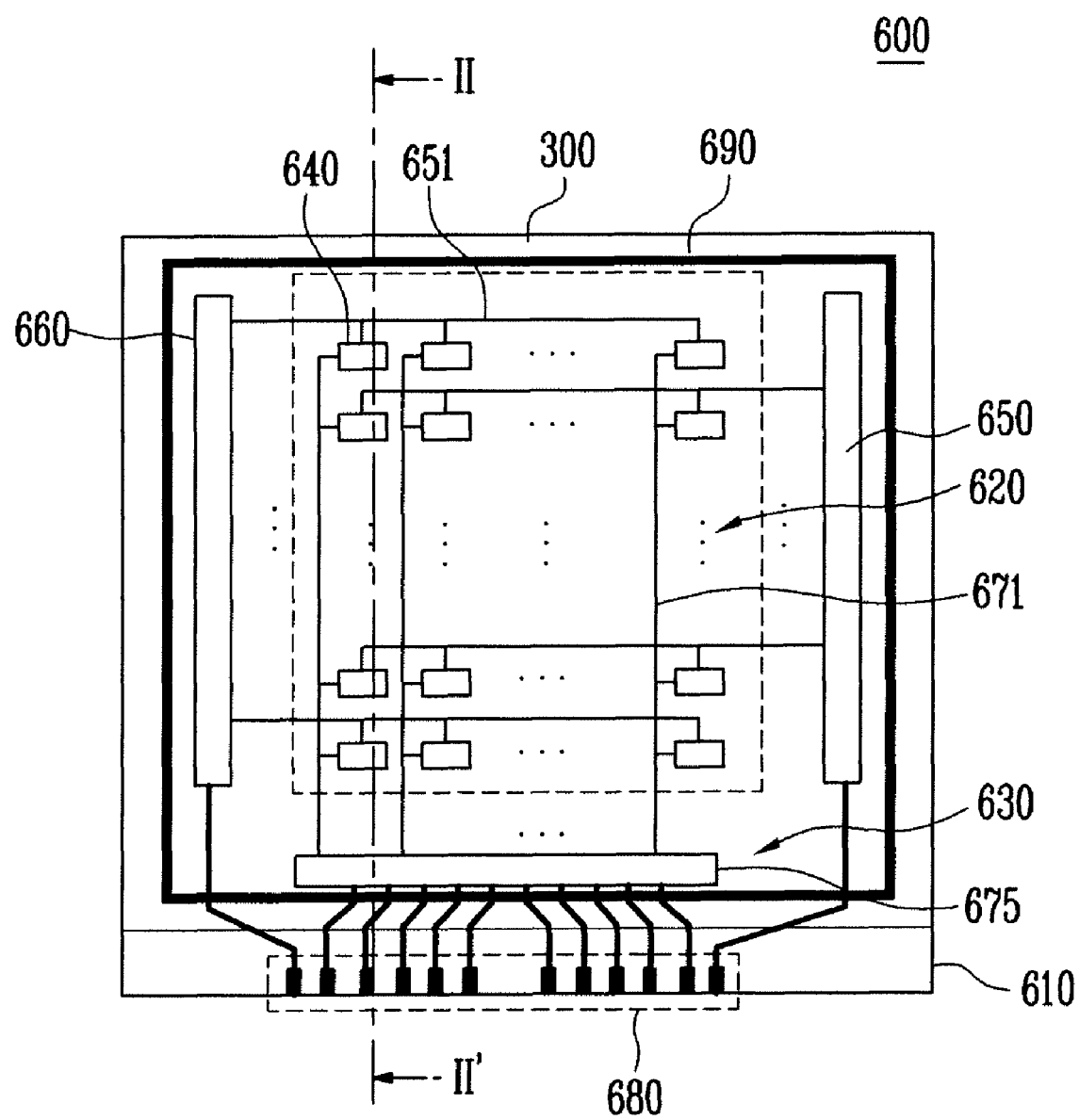
FIG. 7 is a plan view showing an organic light emitting display according to an embodiment of the present invention.

FIG. 7 is a plan view showing an organic light emitting display 600 according to an embodiment of the present invention.

With reference to FIG. 7, the organic light emitting display 600 is divided into a display region 620 and a non-display region 630. A plurality of pixel portions (having a plurality of organic light emitting diodes) 640 are formed on (or at or within) the display region 620, and each of the organic light emitting diodes of the pixel portions 640 is composed of a first electrode, an organic thin film, and a second electrode. The organic light emitting display 600 includes a sealing substrate 670 (e.g., see FIG. 8). The sealing substrate 670 is adhered to the substrate 610 by a sealing material 690 coated along a peripheral boundary (or direction) of the display region 620.

Here, the substrate 610 of the organic light emitting display 600 is defined by the display region 620 and the non-display region 630. The non-display region 630 encloses the display region 620. One or more organic light emitting diodes of a respective one of the pixel portions 640 are formed with a scan line 651 and a data line 671 at the display region 620 of the substrate 610 in a matrix. A scan line 651, a data line 671, a power supply line for an operation of one or more organic light emitting diodes of a respective one of the pixel portions 640, a scan driver 650, and a data driver 675 are formed on the non-display region 630. The scan line 651 and the data line 671 of the non-display region 630 extend from the scan line 651 and the data line 671 of the display region 620. The scan driver 650 and the data driver 675 process a signal provided from an exterior through a pad portion, and supply the signal to the scan line 651 and the data line 671, respectively.

Figure 8:
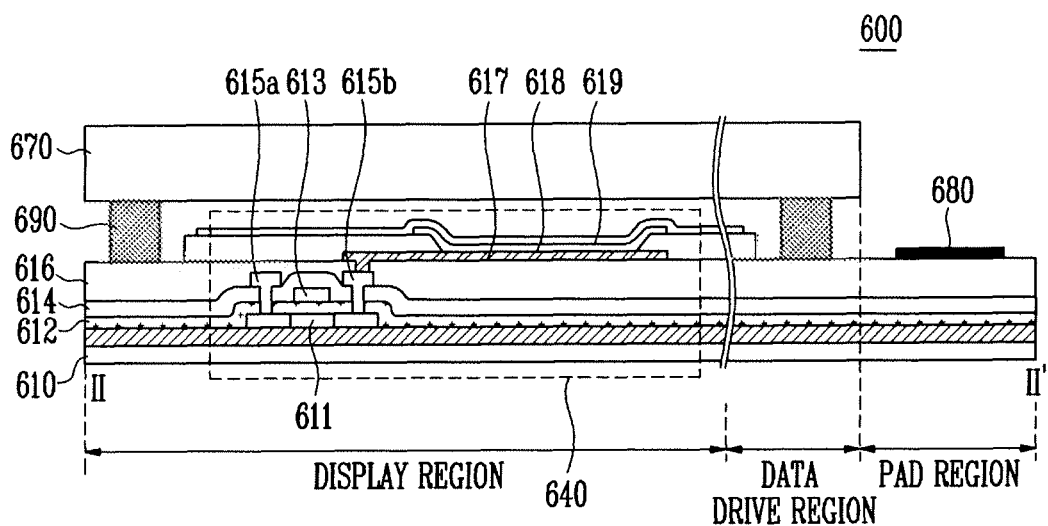
FIG. 8 is a cross-sectional view of the organic light emitting display taken along a line II-II' of FIG. 7.

FIG. 8 is a cross-sectional view of the organic light emitting display 600 taken along a line II-II' of FIG. 7.

Referring to FIG. 8, a pixel portion 640 includes at least one organic light emitting diode formed on the display region 620. The organic light emitting diode includes an anode electrode (or a first electrode) 617, a cathode electrode (or a second electrode) 619, and an organic emission layer 618. The organic emission layer 618 is formed between the anode electrode 617 and the cathode electrode 619. In one embodiment, the organic emission layer 618 includes a hole transport layer, an organic emission layer, and an electron transport layer, which are laminated. The organic light emitting diode may further include a hole injection layer and an electron injection layer. Further, the pixel portion 640 including the organic light emitting diode may further include a switching transistor and a capacitor. The switching transistor controls an operation of the organic light emitting diode of the pixel portion 640. The capacitor maintains a signal.

In FIG. 8, a buffer layer is shown to be formed on the substrate 610 of the display region and the non-display region. The buffer layer prevents (or reduces) a damage of the substrate 610 due to heat. The buffer layer cuts off ions from the substrate 610 to be diffused to an exterior. The buffer layer is formed of an insulation film such as a silicon oxide ($SiO_2$) or a silicon nitride film ($SiN_x$).

After forming a semiconductor layer for providing an active layer on the buffer layer of the display region, a gate insulation film 612 is formed on an upper (or entire upper) surface of the display region including the semiconductor layer.

A gate electrode 613 is formed on a gate insulation film 612 at an upper portion of the semiconductor layer. Here, a scan line is formed at the display region to be connected to the gate electrode 613. A portion of the scan line is formed at the non-display region to extend from the scan line of the display region 620.

The gate electrode 613 and the scan line are formed by a metal such as molybdenum (Mo), tungsten (W), titanium (Ti), or aluminum (Al), an alloy thereof, or a laminate structure thereof.

An interlayer dielectric 614 is formed on an upper (or entire upper) surface of the display region and the non-display region including the gate electrode 613. Further, the interlayer dielectric 614 and the gate insulation film 612 are patterned to form contact hole(s) for exposing part(s) of the semiconductor layer that may be predetermined. Source and drain electrodes 615a and 615b are formed to be connected to the semiconductor layer through the contact hole(s). Here, a data line is formed at the display region to be connected to the source and drain electrodes 615a and 615b. A portion of the data line and a pad portion 680 are formed at the non-display region to extend from the data line of the display region and to receive respective signals from an exterior.

The source and drain electrodes 615a and 615b, the data line, and the pad portion 680 are formed by a metal such as molybdenum (Mo), tungsten (W), titanium (Ti), aluminum (Al), an alloy thereof, or a laminate structure thereof.

A planarization layer 616 is formed on an upper (or an entire upper) surface of the display region and the non-display region to planarize the substrate 610 on which a thin film is formed. Further, the planarization layer 616 of the display region is patterned to form a via hole for exposing part(s) of the source or drain electrode 615a or 615b. An anode electrode 617 is formed to be connected to the source or drain electrode 615a or 615b through the via hole.

After a pixel definition film is formed on the planarization layer 616 to expose a region of the anode electrode 617, an organic emission layer 618 is formed on the exposed anode electrode 617. A cathode electrode 619 is formed on a pixel definition film including the organic emission layer 618.

Moreover, the sealing substrate 670 is formed to have a size corresponding to a display region and a driver (e.g., a data drive region). A substrate made of a transparent material such as glass is used as the sealing substrate 670. In one embodiment, a substrate made of silicon oxide ($SiO_2$) is used as the sealing substrate 670. The sealing substrate 670 can be adhered to the substrate 610 by a sealing material 690 formed along a peripheral boundary (or part) of the substrate 610. The sealing material 690 can be formed of various suitable materials. In one embodiment, the sealing material 690 is formed of a frit glass. The frit glass can effectively cut off a penetration of oxygen and/or moisture and may be better than other suitable sealing material. For example, the frit glass may be formed by at least one material selected from the group consisting of $K_2O$, $Fe_2O_3$, $Sb_2O_3$, $ZnO$, $P_2O_5$, $V_2O_5$, $TiO_2$, $Al_2O_3$, $WO_3$, $SnO$, $PbO$, and combinations thereof.

In addition, to couple the pad portion 680 formed on a pad portion region of the substrate 610 with a flexible printed circuit board (FPCB), the sealing substrate 670 formed on the pad portion 680 is scribed to expose the pad portion 680 to an exterior. The pad portion 680 applies a signal provided through the FPCB to a scan driver and a data driver to drive the organic light emitting diode of the pixel portion 640. Furthermore, the FPCB can provide a controller for supplying a control signal to the organic light emitting display 600 and a power source.

Figure 9A:
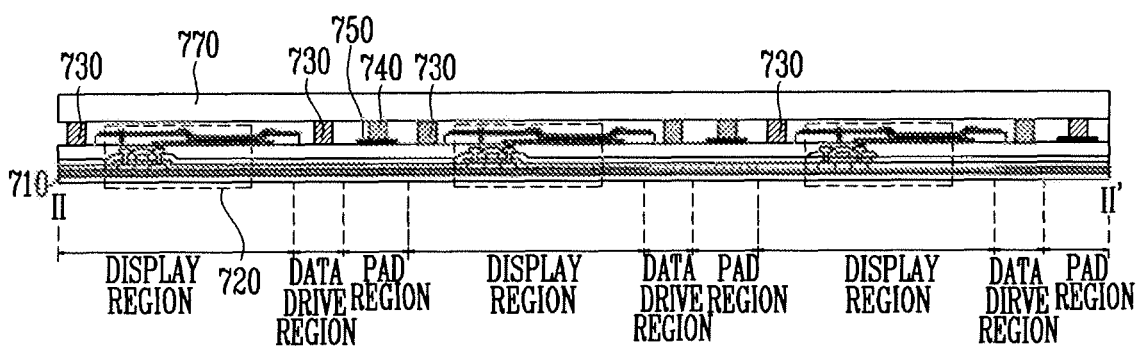
FIG. 9A, FIG. 9B, and FIG. 9C are cross-sectional views of the organic light emitting display of FIG. 8, and are for describing a process for forming the organic light emitting display.
Figure 9B:
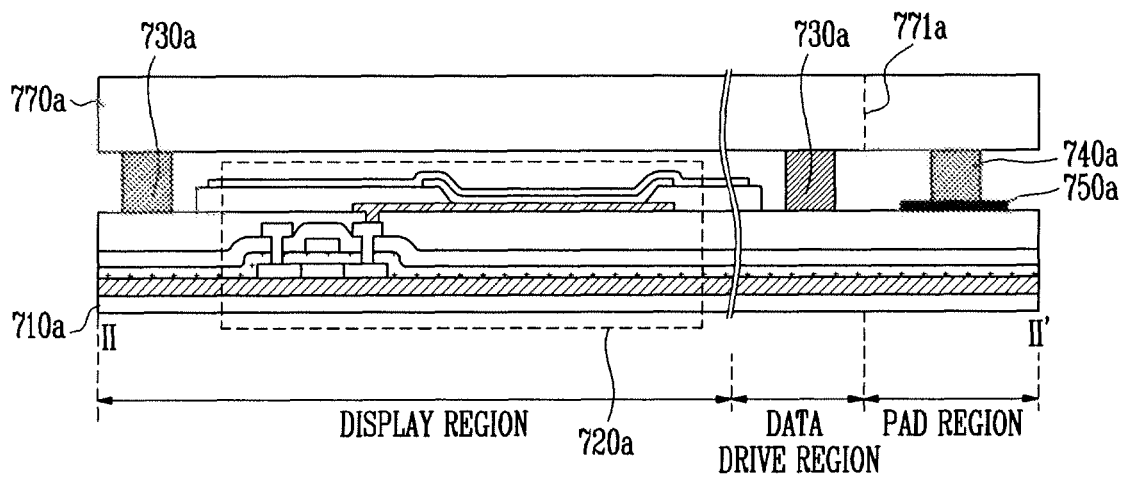
Figure 9C:
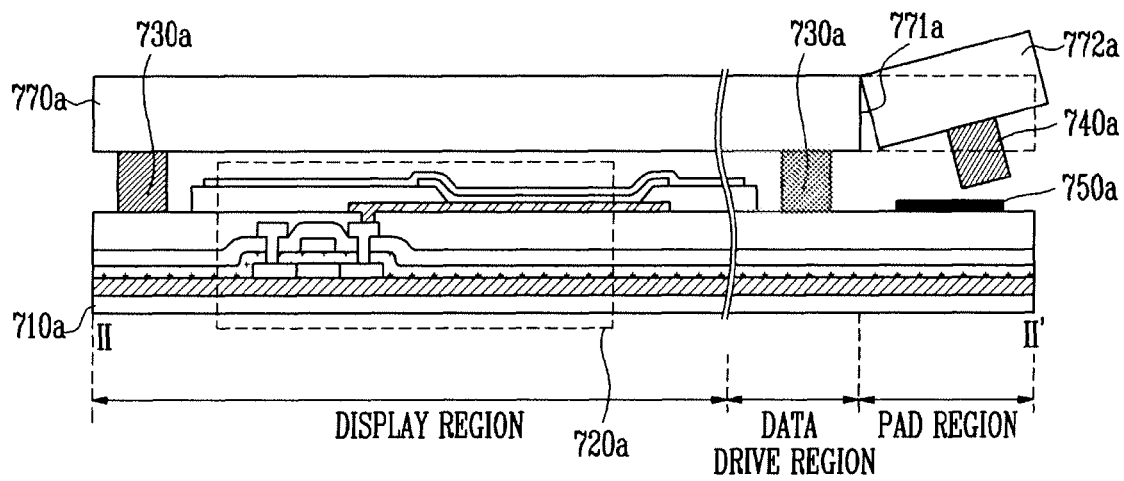

FIG. 9A to FIG. 9C are cross-sectional views of an organic light emitting display that is substantially similar to the organic light emitting display 600 of FIG. 8 for describing a process for forming an organic light emitting display.

With reference to FIG. 9A, in each unit panel, after a plurality of pixel portions (having a plurality organic light emitting diodes) 720 are formed on a mother substrate 710, a sealing substrate 770 is adhered and fixed to the mother substrate 710 to have a size corresponding to that of the mother substrate 710. Next, after the adhered and fixed mother substrate 710 and sealing substrate 770 are scribed to separate them from each unit panel, the flexible printed circuit board is connected on a pad portion of each unit panel to manufacture each organic light emitting display.

In more detail, a display region and a non-display region are formed on the mother substrate 710. A plurality of organic light emitting diodes of the pixel portions 720 are formed on (or at or within) the display region. The non-display region is formed at a peripheral part of the display region. A pad portion 750 and a scan driver are formed on the non-display region.

In addition, on the sealing substrate 770 arranged at an upper portion of the mother substrate 710, a peripheral part of the display region on which the organic light pixel portion 720 is formed, namely, an upper portion of a data driver region is coated with a sealing material 730. Further, a spacer 740 is formed on each pad portion 750. As illustrated, as the spacer 740 is formed on the pad portion 750, the mother substrate 710 is spaced apart from the sealing substrate 770 by a height of the spacer 740, thereby preventing an adhesion of the mother substrate 710 and the sealing substrate 770. Accordingly, it can be removed using the sealing substrate 770 formed at an upper portion of the pad portion 750.

The sealing material 730 and the spacer 740 may be formed by the same material or various other suitable materials. For example, the frit glass may be formed by at least one material selected from the group consisting of $K_2O$, $Fe_2O_3$, $Sb_2O_3$, $ZnO$, $P_2O_5$, $V_2O_5$, $TiO_2$, $Al_2O_3$, $WO_3$, $SnO$, $PbO$, and combinations thereof.

Subsequently, a laser or ultraviolet ray is irradiated onto the sealing material 730 to melt the sealing material 730, thereby adhering the sealing substrate 770 and the mother substrate 710 to each other. Accordingly, respective organic light emitting diodes 720 formed on the mother substrate 710 are sealed to be protected from oxygen and moisture. Here, since the spacer 740 is not melted by the laser or ultraviolet, the sealing substrate 770 has the adhesion. Although the spacer 740 is attached or detached on or from the mother substrate 710, it does not stain the substrate 710.

After the sealing material 730 is melted to adhere the mother substrate 710 and the sealing substrate 770 to each other, the adhered mother substrate 710 and sealing substrate 770 are scribed to divide into respective unit panels.

With reference to FIG. 9B, the organic light emitting display divided into the respective unit panels includes a plurality of pixel portions (having a plurality of organic light emitting diodes) 720a, a sealing material 730a, a pad portion 750a, a spacer 740a, and a sealing substrate 770a. The plurality of organic light emitting diodes 720a are formed on (or at or within) a display region of the substrate 710a. The sealing material 730a is formed on a data drive region. The pad portion 750a is formed on a pad portion region. The spacer 740a is formed on the pad portion 750a. The sealing substrate 770a has a size corresponding to the substrate 710a.

Referring to FIG. 9C, the sealing substrate 770a is scribed at a scribe line 771a to correspond to a boundary of a data drive region and a pad portion region, and a scribed portion 772a of the sealing substrate 770a is removed at the scribe line 771a to expose the pad portion 750a to an exterior to contact with the flexible printed circuit board. Here, because the spacer 740a formed at an inner side surface of the sealing substrate 770a has an adhesion with the sealing substrate 770a, it is (or is naturally) separated from the substrate 710a.

As mentioned above, as the spacer 740a is formed on the pad portion 750a, a contact occurrence between the substrate 710a and the sealing substrate 770a may be prevented, and the substrate 710a and the sealing substrate 770a may be spaced apart from each other by a height of the spacer 740a on the pad portion 750a.

In view of the foregoing, according to an embodiment of the present invention, as a spacer is formed between a mother substrate at an outer side of a test wiring and a sealing substrate, a constant gap is maintained between the test wiring and the sealing substrate to prevent the substrate and the sealing substrate from contacting with each other.

In addition, in an embodiment of the present invention, since a spacer is formed on a pad portion, a constant interval is maintained between the pad portion and a sealing substrate, thereby preventing the sealing substrate from contacting with a mother substrate. In addition, the sealing substrate arranged on the pad portion can be easily removed.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method for manufacturing an organic light emitting display, the method comprising:
    forming a plurality of pixel portions on a mother substrate;
    forming a test wiring for testing the plurality of pixel portions at a peripheral portion of the mother substrate;
    forming a sealing material on one surface of a sealing substrate to enclose the plurality of pixel portions, the sealing substrate being spaced apart from the mother substrate;
    forming a spacer at a side region of the one surface of the sealing substrate on which the sealing material is also formed;
    adhering the mother substrate and the sealing substrate to each other with the sealing material to seal the pixel portions within an enclosure formed by the mother substrate, the sealing substrate, and the sealing material; and
    scribing and removing a part of the sealing substrate to expose the test wiring, the removed part of the sealing substrate being arranged over a portion of the test wiring,
    wherein the spacer is not adhered to the mother substrate.

2. The method as claimed in claim 1, wherein the spacer comprises a substantially identical material as that of the sealing material.

3. The method as claimed in claim 1, wherein the spacer is formed on a side portion of the mother substrate on which the test wiring is formed.

4. The method as claimed in claim 1, wherein the sealing material is an inorganic material, and wherein the forming of the sealing material comprises irradiating the inorganic sealing material with a laser beam or ultraviolet rays to melt the inorganic sealing material.

5. The method as claimed in claim 4, wherein the inorganic sealing material is a frit glass.

6. A method for manufacturing an organic light emitting display, the method comprising:
    forming a plurality of pixel portions on a mother substrate;
    forming a test wiring for testing the plurality of pixel portions at a peripheral portion of the mother substrate;
    forming a sealing material on one surface of a sealing substrate to enclose the plurality of pixel portions, the sealing substrate being spaced apart from the mother substrate;
    forming a spacer at a side region of the one surface of the sealing substrate on which the sealing material is also formed;
    adhering the mother substrate and the sealing substrate to each other with the sealing material to seal the pixel portions within an enclosure formed by the mother substrate, the sealing substrate, and the sealing material; and
    scribing and removing a part of the sealing substrate to expose the test wiring, the removed part of the sealing substrate being arranged over a portion of the test wiring,
    wherein the spacer is formed on the portion of the test wiring over which the removed part of the sealing substrate is arranged.

7. A method for manufacturing an organic light emitting display, the method comprising:
    forming an organic light emitting diode at a display region of a substrate;
    forming a driver and a pad portion at a non-display region of the substrate, the substrate being divided into the display region and the non-display region;

forming a sealing material on one surface of a sealing substrate to cover the display region of the substrate, the sealing substrate being spaced apart from the substrate;

forming a spacer at a side region of the one surface of the sealing substrate on which the sealing material is also formed;

adhering the substrate and the sealing substrate to each other with the sealing material to seal the display region of the substrate; and scribing and removing a part of the sealing substrate to expose the pad portion, the removed part of sealing substrate being arranged over a part of the pad portion, wherein the spacer is not adhered to the substrate.

8. The method as claimed in claim 7, wherein the spacer comprises a substantially identical material as that of the sealing material.

9. The method as claimed in claim 7, wherein the sealing material is formed on a portion of the driver.

10. The method as claimed in claim 7, further comprising connecting the exposed pad portion to a flexible printed circuit board.

11. The method as claimed in claim 7, wherein the sealing material is an inorganic material, and wherein the forming of the sealing material comprises irradiating the inorganic sealing material with a laser beam or ultraviolet rays to melt the inorganic sealing material.

12. The method as claimed in claim 11, wherein the inorganic sealing material is a frit glass.

13. A method for manufacturing an organic light emitting display, the method comprising:

forming an organic light emitting diode at a display region of a substrate;

forming a driver and a pad portion at a non-display region of the substrate, the substrate being divided into the display region and the non-display region;

forming a sealing material on one surface of a sealing substrate to cover the display region of the substrate, the sealing substrate being spaced apart from the substrate;

forming a spacer at a side region of the one surface of the sealing substrate on which the sealing material is also formed;

adhering the substrate and the sealing substrate to each other with the sealing material to seal the display region of the substrate; and scribing and removing a part of the sealing substrate to expose the pad portion, the removed part of sealing substrate being arranged over a part of the pad portion, wherein the spacer is formed on the part of the pad portion over which the sealing substrate is arranged.

14. A method for manufacturing an organic light emitting display, the method comprising:

forming a plurality of organic light emitting diodes on a mother substrate;

forming a test wiring for testing the plurality of organic light emitting diodes at a peripheral portion of the mother substrate;

forming a sealing material on one surface of a sealing substrate to enclose the plurality of organic light emitting diodes, the sealing substrate being spaced apart from the mother substrate;

forming a spacer at a side region of the one surface of the sealing substrate on which the sealing material is also formed;

adhering the mother substrate and the sealing substrate to each other with the sealing material to seal the plurality of organic light emitting diodes within an enclosure formed by the mother substrate, the sealing substrate, and the sealing material; and scribing and removing a part of the sealing substrate to expose the test wiring, the removed part of sealing substrate being arranged over a portion of the test wiring, wherein the spacer is not adhered to the mother substrate.

15. The method as claimed in claim 14, wherein the spacer comprises a substantially identical material as that of the sealing material.

16. The method as claimed in claim 14, wherein the spacer is formed on a side portion of the mother substrate on which the test wiring is formed.

17. The method as claimed in claim 14, wherein the sealing material is an inorganic material, and wherein the forming of the sealing material comprises irradiating the inorganic sealing material with a laser beam or ultraviolet rays to melt the inorganic sealing material.

18. The method as claimed in claim 17, wherein the inorganic sealing material is a frit glass.

19. The method as claimed in claim 14, further comprising connecting the exposed test wiring to a probe to panel test the organic light emitting display.

20. A method for manufacturing an organic light emitting display, the method comprising:

forming a plurality of organic light emitting diodes on a mother substrate;

forming a test wiring for testing the plurality of organic light emitting diodes at a peripheral portion of the mother substrate;

forming a sealing material on one surface of a sealing substrate to enclose the plurality of organic light emitting diodes, the sealing substrate being spaced apart from the mother substrate;

forming a spacer at a side region of the one surface of the sealing substrate on which the sealing material is also formed;

adhering the mother substrate and the sealing substrate to each other with the sealing material to seal the plurality of organic light emitting diodes within an enclosure formed by the mother substrate, the sealing substrate, and the sealing material; and scribing and removing a part of the sealing substrate to expose the test wiring, the removed part of sealing substrate being arranged over a portion of the test wiring, wherein the spacer is formed on the portion of the test wiring over which the removed part of the sealing substrate is arranged.

* * * * *